United States Patent [19]

Inami et al.

[11] Patent Number: 4,492,917
[45] Date of Patent: Jan. 8, 1985

[54] DISPLAY DEVICE FOR DISPLAYING AUDIO SIGNAL LEVELS AND CHARACTERS

[75] Inventors: Mamoru Inami, Yokohama; Yoshiaki Tanaka, Fujisawa; Zenju Ohtsuki, Tokyo, all of Japan

[73] Assignee: Victor Company of Japan, Ltd., Yokohama, Japan

[21] Appl. No.: 412,970

[22] Filed: Aug. 30, 1982

[30] Foreign Application Priority Data

Sep. 3, 1981 [JP] Japan ................................ 56-138867
Sep. 3, 1981 [JP] Japan ................................ 56-138868
Sep. 3, 1981 [JP] Japan ................................ 56-138869
Sep. 3, 1981 [JP] Japan ................................ 56-138870

[51] Int. Cl.³ .......................................... G01R 23/16
[52] U.S. Cl. ...................................... 324/77 A; 381/48
[58] Field of Search ............. 381/48; 324/77 R, 77 A, 324/77 B, 77 E, 78 F; 360/32

[56] References Cited

U.S. PATENT DOCUMENTS 3,387,090  6/1968  Bridges ........................... 324/77 A
4,335,276  6/1982  Bull ..................................... 381/48

*Primary Examiner*—Michael J. Tokar
*Attorney, Agent, or Firm*—Posnack, Roberts, Cohen & Spiecens

[57] ABSTRACT

A level display device for audio signal comprises a plurality of bandpass filters having filtering bands of respectively different center frequencies, for band-dividing and filtering an input signal supplied thereto through an input terminal, a level indication signal producing circuit for converting the input signal into a signal in synchronism with a horizontal synchronizing signal of a video signal and having a pulse width in accordance with the level of the horizontal synchronizing signal, and serially obtaining the converted signal in sychronism with a vertical synchronizing signal of the video signal by successive time-division carried out during a vertical scanning period, a character indication signal producing circuit stored with information signals for displaying characters and the like, for serially obtaining a character indication signal in synchronism with a synchronizing signal of the video signal, and a video signal composing circuit driven by the video signal, for obtaining a video signal by composing an output of the level indication signal producing circuit and an output of the character indication signal producing circuit. The level display device composes and displays bars in a horizontal direction corresponding to the audio signal level, characters, and the like, on a screen of a picture tube, by the outputs of the level indication signal producing circuit and the character indication signal producing circuit.

8 Claims, 24 Drawing Figures

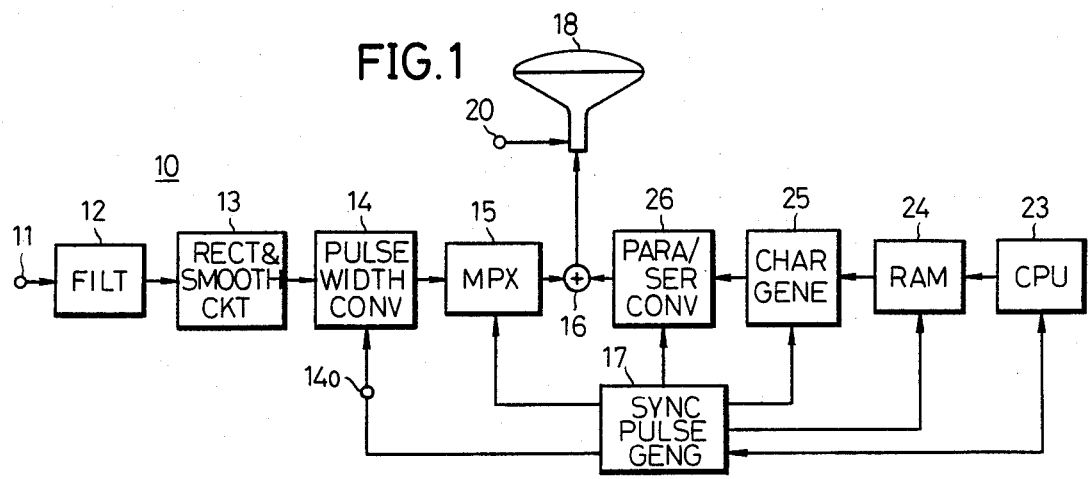
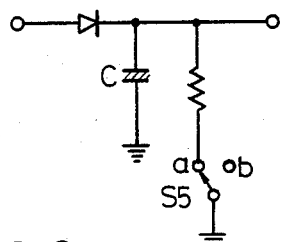
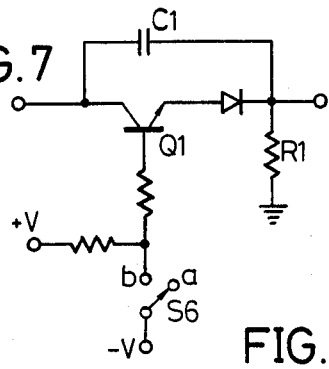
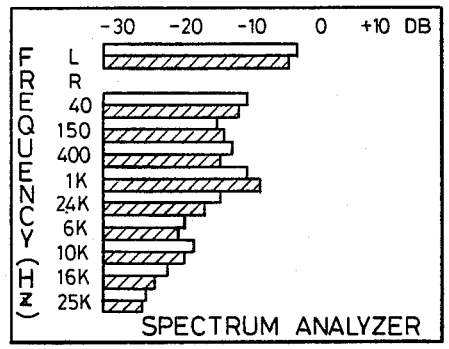
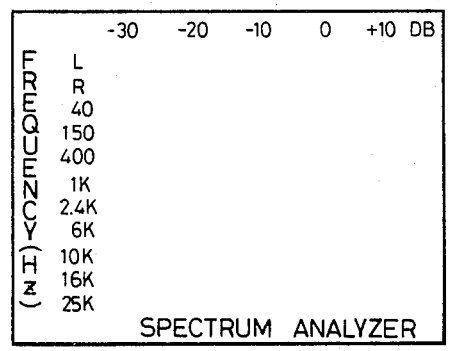
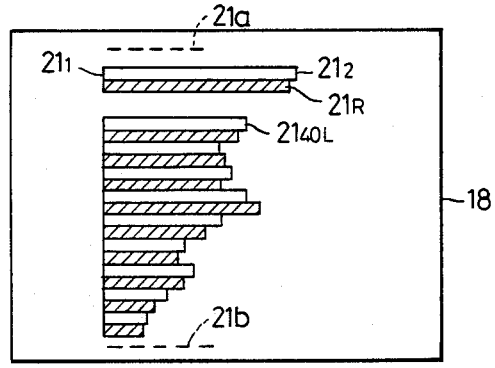

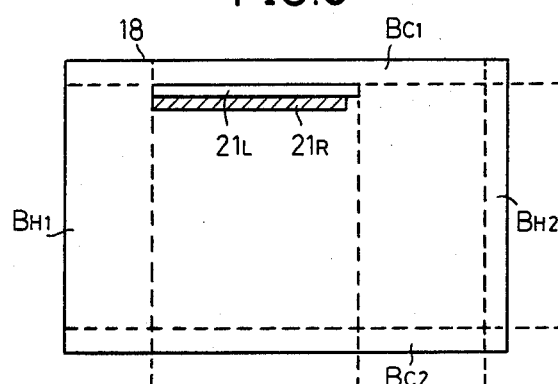
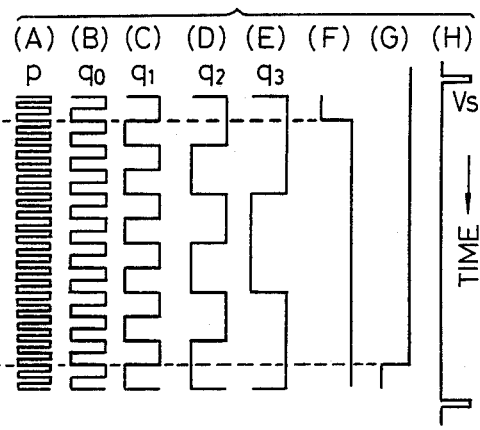
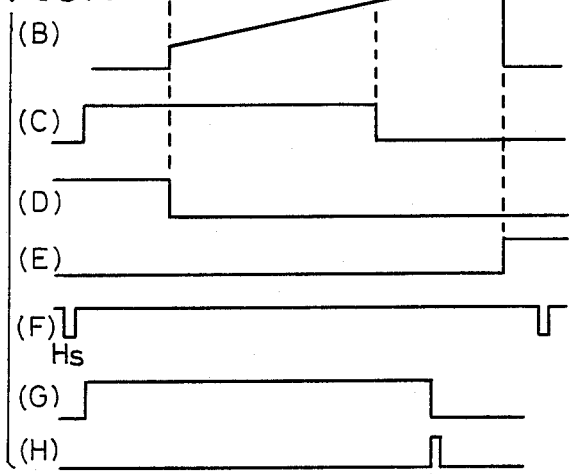
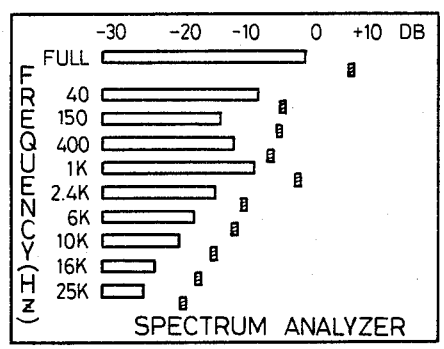
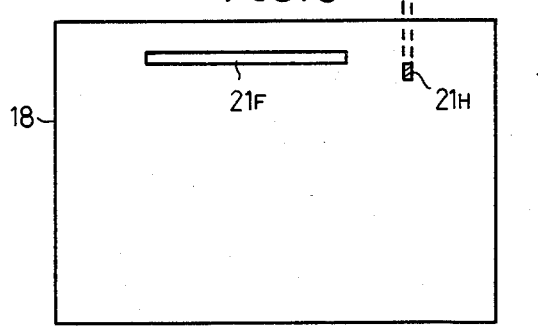
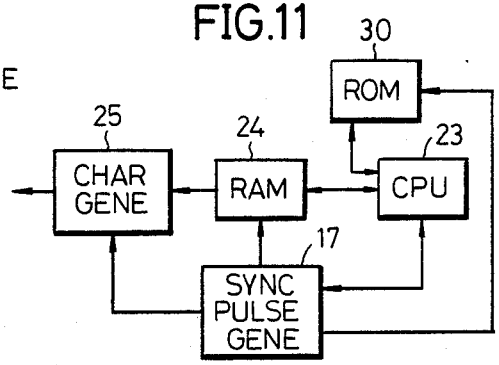

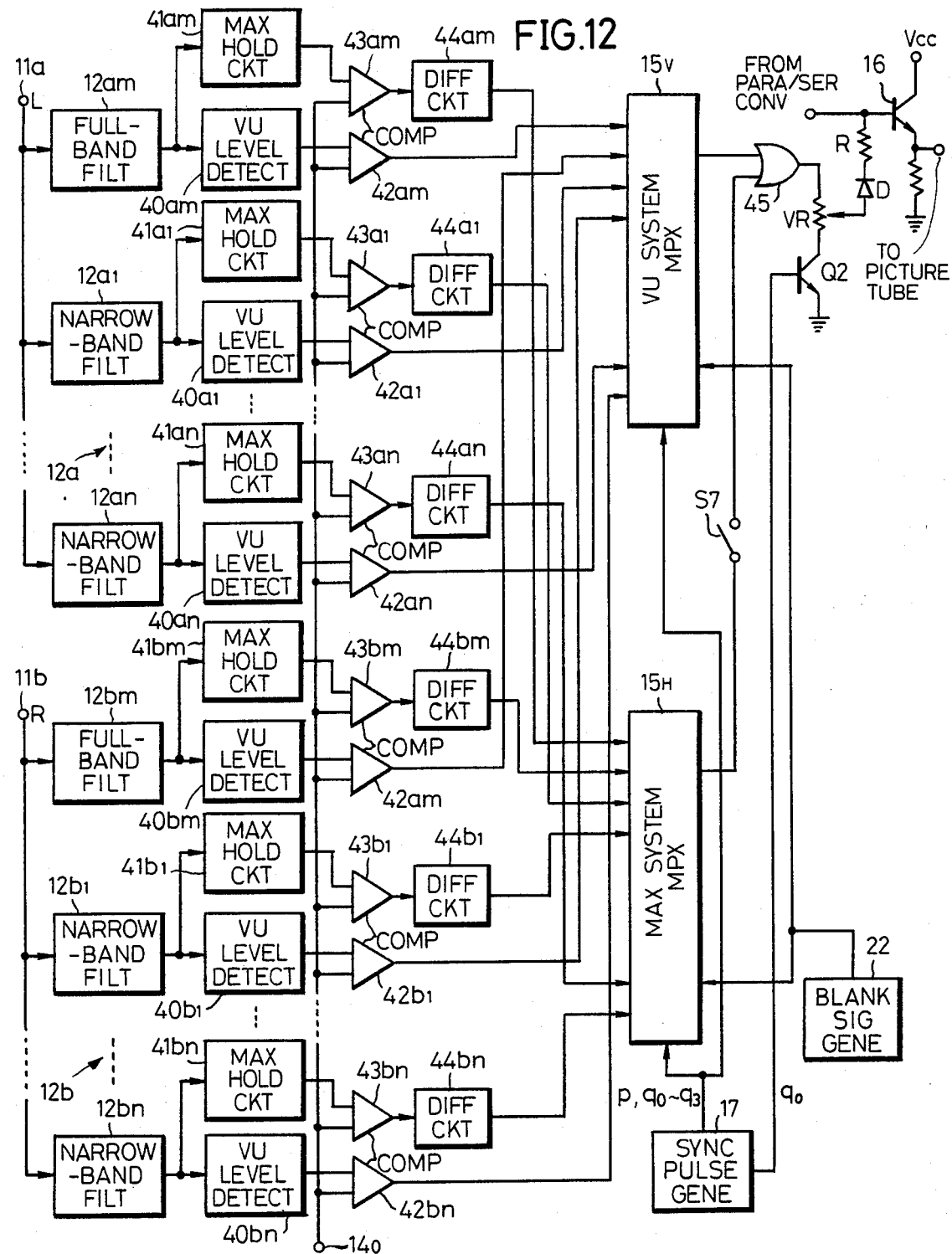

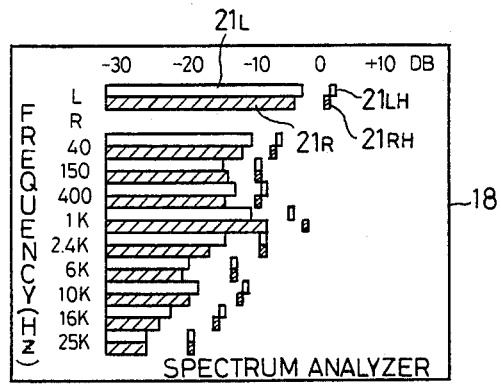
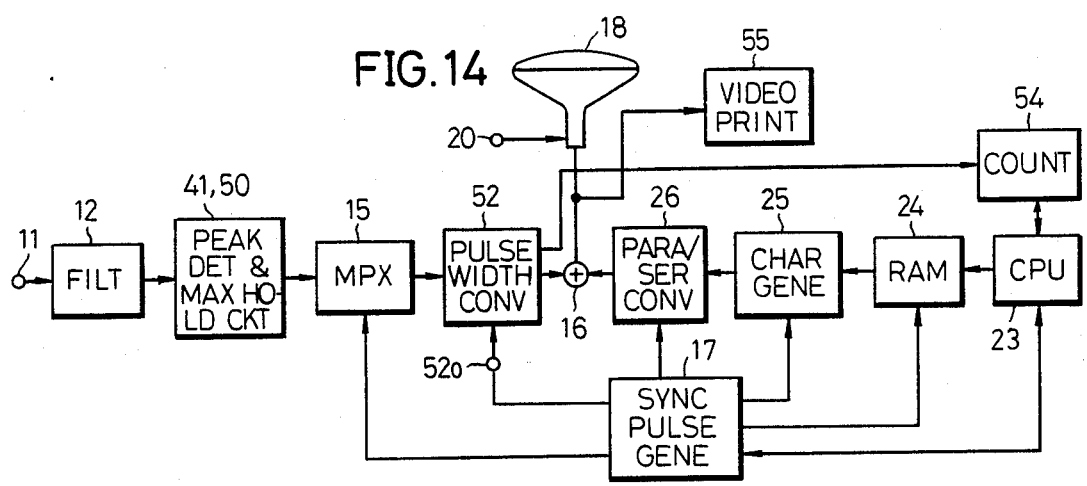
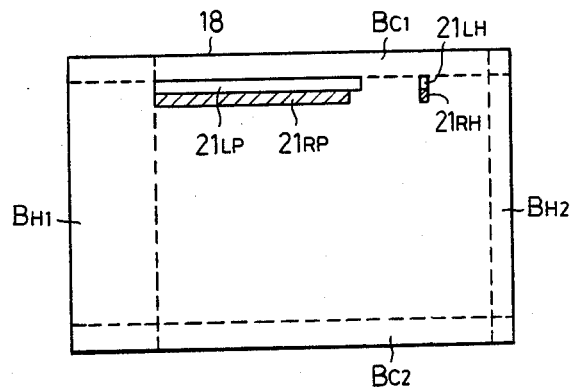

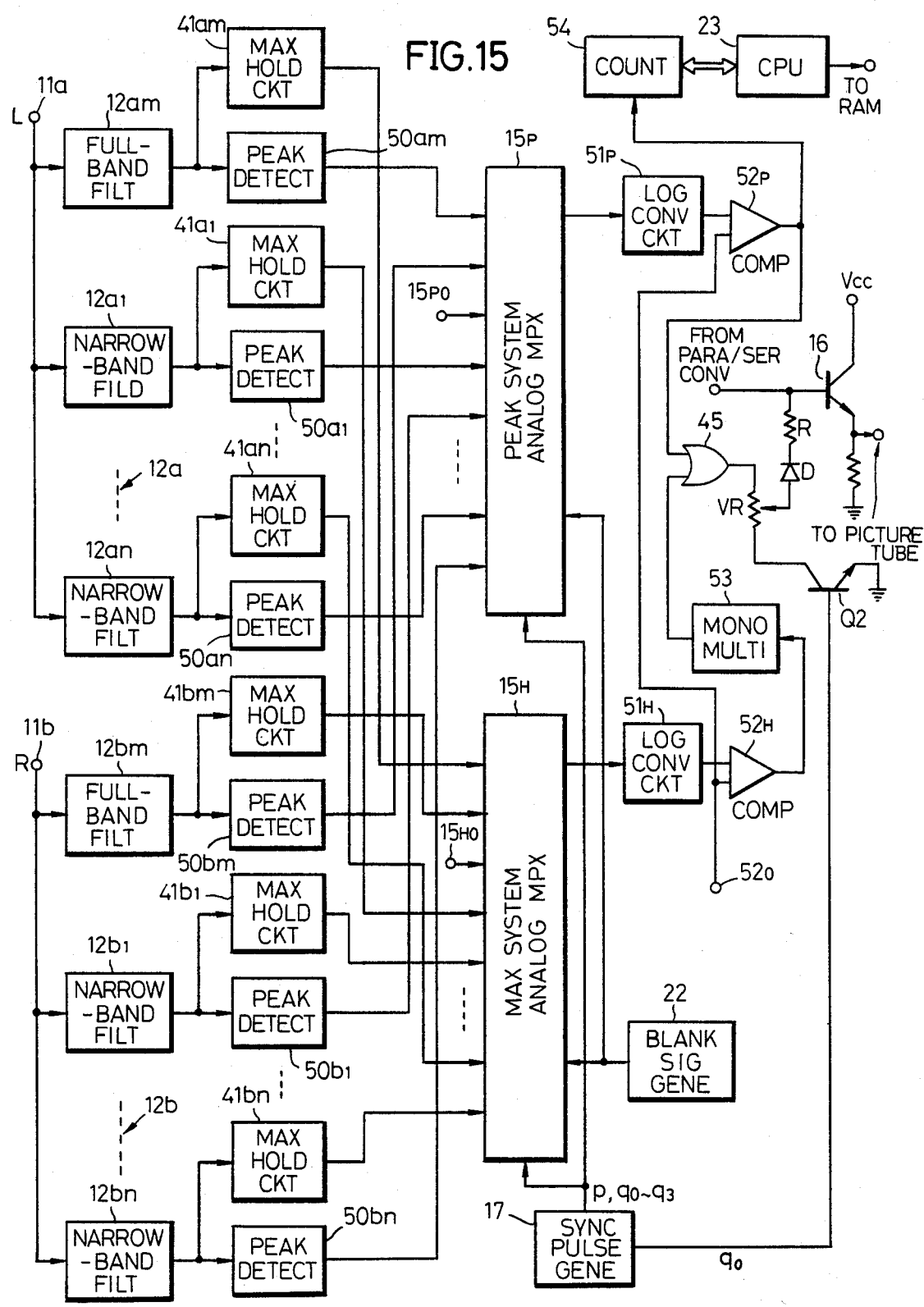

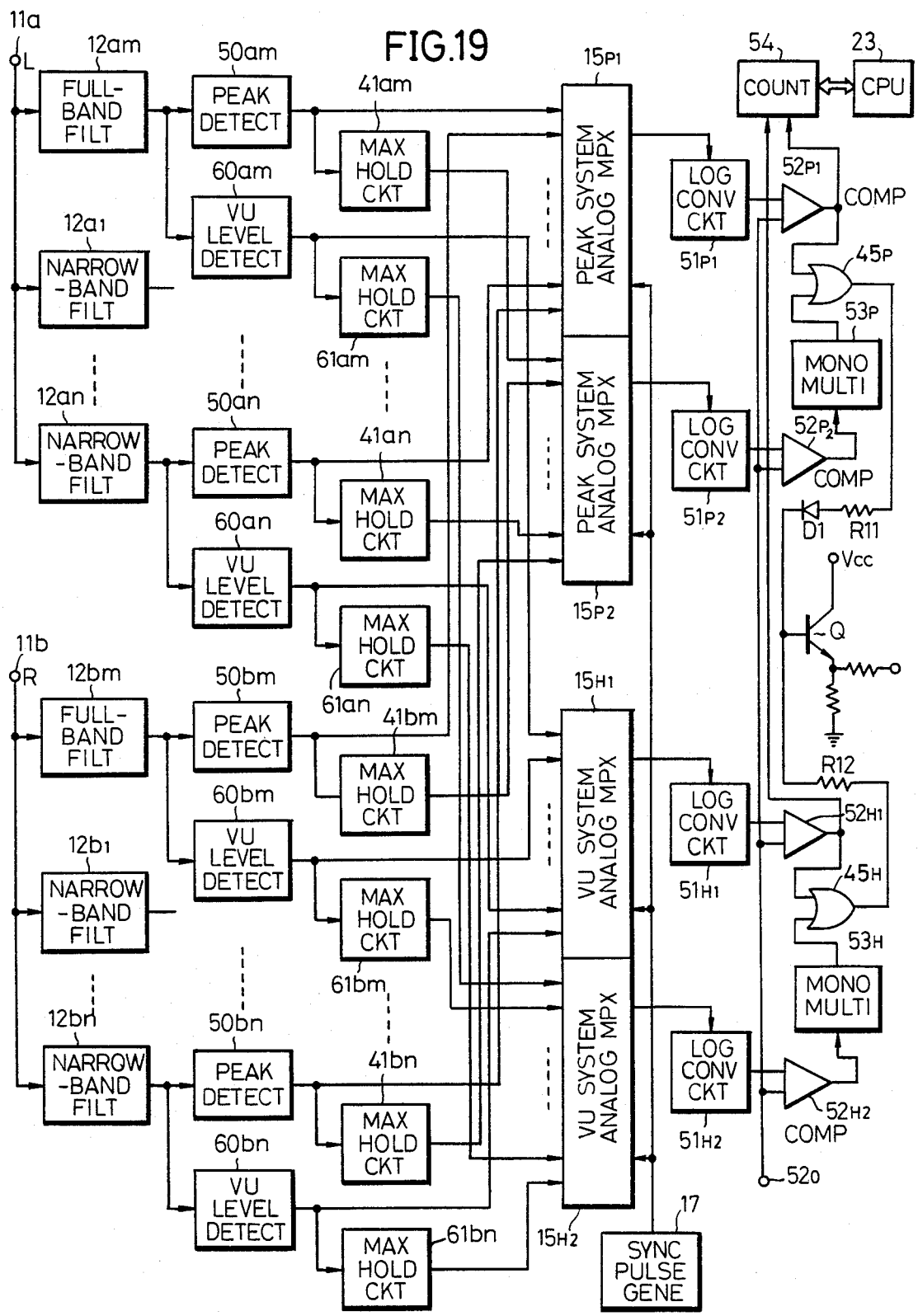

DISPLAY DEVICE FOR DISPLAYING AUDIO SIGNAL LEVELS AND CHARACTERS

BACKGROUND OF THE INVENTION

The present invention generally relates to level display devices for audio signals, and more particularly to a level display device for audio signal constructed to display bars having lengths corresponding to the input signal levels on a picture tube.

Generally, when recording an audio signal, there are cases where it is desirable to carry out recording by increasing or decreasing levels in a predetermined frequency band. In addition, when degradation is introduced in the fidelity of a reproduced audio signal in a reproducing apparatus due to effects caused by the frequency characteristics of audio equipments themselves such as speakers and pickup cartridges, the transfer characteristic of a listening room, and the like, there are cases where it is desirable to correct the levels in a predetermined frequency band. Further, there are cases where the frequency characteristic is not made flat during the recording and reproduction, and the frequency characteristic is set to a predetermined characteristic according to the needs. In the above described cases, graphic equalizers capable of variably adjusting the signal level in each of the divided frequency bands are used. When adjusting the level by the graphic equalizer, a level display device is used for displaying the levels throughout the entire band of the input signal and the signal levels in each of the frequency bands.

A conventional level display device was constructed to illuminate a number of light emitting diodes corresponding to the number of input signal levels. Moreover, another conventional level display device was constructed to display bars having lengths corresponding to the input signal levels on a screen of a picture tube.

However, in the above conventional level display devices, numerals for indicating each of the frequency bands, and numerals or scales indicating the level of the signal, are marked on a manipulation panel and the like. Accordingly, there was difference in brightness between the above numerals or scale and the level indication part such as bars displayed on the screen of the picture tube, and there was a disadvantage in that it was difficult to accurately read out the indication visually.

On the other hand, another conventional level display device used comparators for each of the frequency bands, for comparing signals in each of the divided frequency bands with a reference level. This conventional device was disadvantageous in that a substantially large number of comparators were required. Hence, this conventional device had a complex circuit construction, and the cost of the device was inevitably high.

Another conventional level display device could only display one kind of level in real-time, for example. Thus, this conventional device was disadvantageous in that a plurality of kinds of level displays such as in real-time, maximum value, and the like, could not be made, and that the display obtained was inconvenient.

SUMMARY OF THE INVENTION

Accordingly, it is a general object of the present invention to provide a novel and useful level display device for audio signals, in which the above described disadvantages have been overcome.

Another and more specific object of the present invention is to provide a level display device provided with switching means for switching and displaying in a real-time display mode or a real-time and maximum value display mode, when displaying the level of an audio signal. According to the device of the present invention, it is possible to selectively switch and display bars respectively in accordance with various needs upon recording.

Still another object of the present invention is to provide a level display device capable of displaying the level of an audio signal by bars and numerical values simultaneously on the same screen of a picture tube.

Another object of the present invention is to provide a level display device comprising comparators provided in a stage succeeding multiplexers which serially obtain signals in accordance with the audio signal level. According to the device of the present invention, the number of pulse width converters (comparators) required can be reduced.

Other objects and further features of the present invention will be apparent from the following detailed description when read in conjunction with the accompanying drawings.

BRIEF DESCRIPTION OF THE DRAWINGS

FIG. 1 is a general systematic block diagram showing a first embodiment of a level display device for audio signal according to the present invention;

FIG. 3 is a diagram for explaining a display pattern on a screen of a picture tube obtained by the circuit shown in FIG. 2;

FIGS. 4(A) through 4(H), and FIGS. 5(A) through 5(H) are graphs respectively showing signal waveforms for obtaining the display pattern shown in FIG. 3;

FIG. 6 is a concrete circuit diagram showing a rectifying and smoothing circuit in the circuit shown in FIG. 2;

FIG. 7 is a concrete circuit diagram showing a differentiating circuit in the circuit shown in FIG. 2;

FIGS. 8A, 8B, and 8C respectively show display patterns obtained by the circuit shown in FIG. 2;

FIGS. 9 and 10 respectively show display patterns in a certain mode, obtained by the circuit shown in FIG. 2;

FIG. 11 is a general systematic block diagram showing another embodiment of an essential part of the block system shown in FIG. 1;

FIG. 12 is a concrete circuit diagram showing a second embodiment of a level display device for audio signal according to the present invention;

FIG. 13 shows a display pattern in a certain mode, obtained by the circuit shown in FIG. 12;

FIG. 14 is a general systematic block diagram showing a third embodiment of a level display device for audio signal according to the present invention;

FIG. 16 is a diagram for explaining a display pattern on a screen of a picture tube obtained by the circuit shown in FIG. 15;

FIG. 19 is a concrete circuit diagram showing a fourth embodiment of a level display device for audio signal according to the present invention.

DETAILED DESCRIPTION

Figure 2:
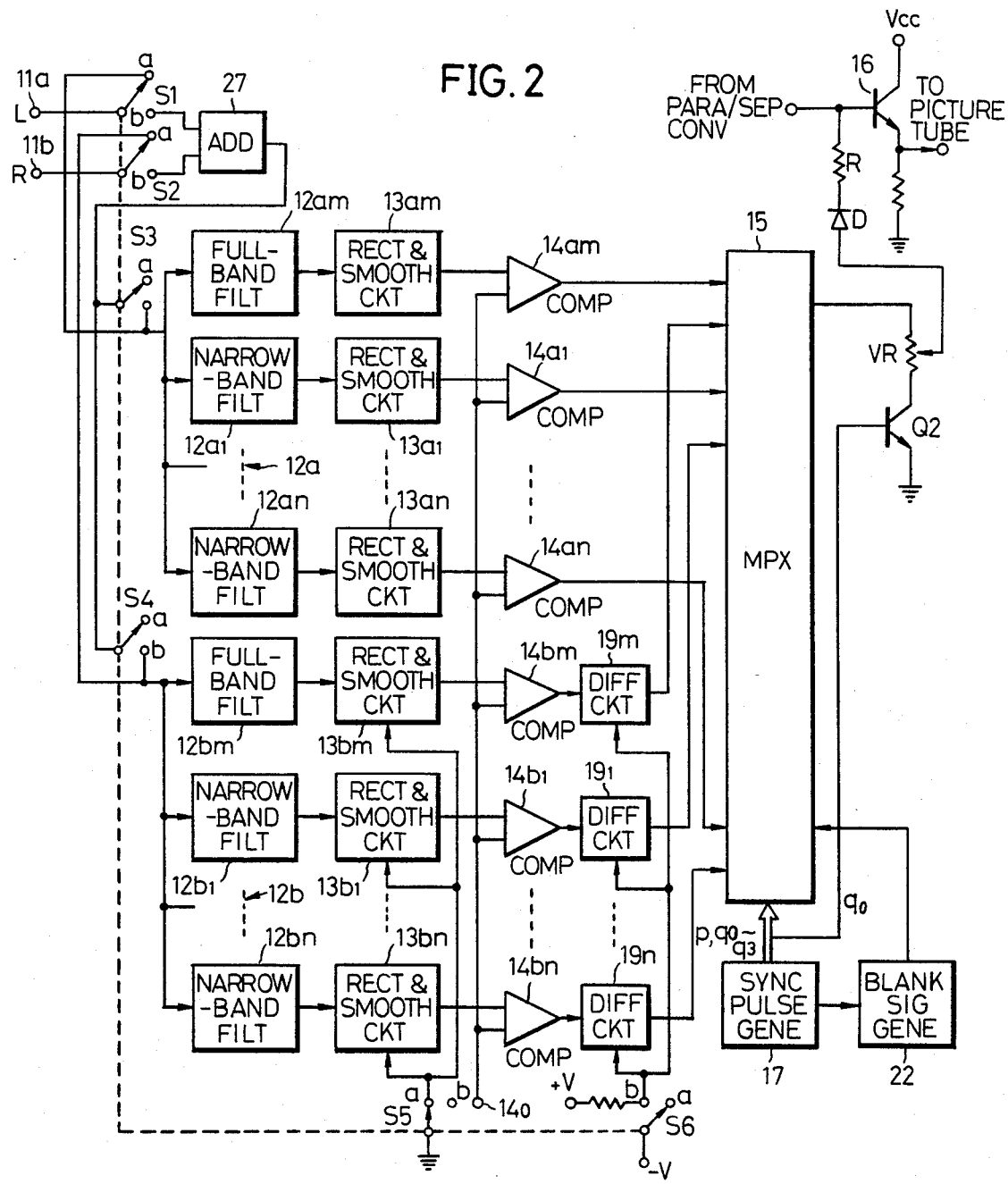
FIG. 2 is a concrete circuit diagram showing an essential part of the block system shown in FIG. 1.

First, description will be given with respect to a first embodiment of a level display device for audio signal according to the present invention. In a level display device 10 shown in FIG. 1, an audio signal applied to an input terminal 11 is divided into a plurality of frequency bands at a filter 12, and then formed into a DC signal by being supplied to a rectifying and smoothing circuit 13. An output signal of the circuit 13 is supplied to a pulse width coverter 14 wherein the signal is converted into a signal in synchronism with a vertical synchronizing signal and has a pulse width in accordance with the input signal level. The converted signal is then supplied to a multiplexer 15, and is serially obtained in successive time division during a horizontal scanning period. The signal thus obtained from the multiplexer 15 is supplied to an adding gate 16 as a level indication signal. The pulse width converter 14 and the multiplexer 15 operate when supplied with a synchronizing signal from a synchronizing pulse generator 17.

On the other hand, a random access memory (RAM) 24 is operated by a control signal from a central processing unit (CPU) 23. In formation containing characters and the like which are to be displayed on a screen of a picture tube 18 is read out from the RAM 24, and supplied to a character generator 25. Binary codes corresponding to predetermined characters are obtained from the character generator 25 in parallel, and supplied to the adding gate 16 as a character indication signal after being converted into a series signal at a parallel-to-serial converter (parallel/serial converter) 26. The above CPU 23, RAM 24, character generator 25, and the parallel/serial converter 26 respectively operate when supplied with the synchronizing signal from the synchronizing pulse generator 17.

The level indication signal from the multiplexer 15 and the character indication signal from the parallel/-serial converter 26 are added at the adding gate 16, and supplied to the picture tube 18. An output of the adding gate 16 is added with the synchronizing signal at the picture tube 18 and formed into a composite video signal. Accordingly, characters and levels are composed and displayed on the picture tube 18.

In FIG. 2, when independently displaying the level of channels, that is, when constantly obtaining spectral display of the input signal level independently for each channel, movable contacts of switches S1 through S6 are respectively connected to terminals a. A left channel (L-channel) input audio signal, for example, which is applied to an input terminal 11a, is supplied to a narrow-bandpass filter 12a comprising narrow-bandpass filters 12a1 through 12an, and to a full-bandpass filter 12am (filter 12), through the switch S1. The narrow-bandpass filters 12a1 through 12an respectively have narrow-passband filter characteristics for filtering narrow bands comprising center frequencies at 40 Hz, 150 Hz, 400 Hz, 1 kHz, 2.4 kHz, 6 kHz, 10 kHz, 16 kHz, and 25 kHz, for example. On the other hand, the full-bandpass filter 12am has a full-bandpass filter characteristic including all the frequency bands of the narrow-passband filter 12a.

Signals filtered and band-divided at the filters 12a1 through 12an, and an output full-band signal of the filter 12am, are respectively supplied to rectifying and smoothing circuits 13a1 through 13an and 13am wherein the signals are rectified and smoothened. Outputs of the circuits 13a1 through 13an and 13am are then supplied to one input terminal of respective comparators 14a1 through 14an and 14am (pulse width converter 14). A comparison voltage shown in FIG. 5(A) is supplied to the other input terminals 14o of the above comparators 14a1 through 14an and 14am. The comparison voltage is in synchronism with the vertical synchronizing signal of a composite video signal shown in FIG. 5(F) which is obtained from the synchronizing signal generator 17, and the voltage level decreases (or increases) with time.

Level comparison is performed between the output signals of the circuits 13a1 through 13an and 13am and the comparison voltage, at the comparators 14a1 through 14an and 14am. Hence, the output signals of the circuits 13a1 through 13an and 13am are respectively converted into pulse signals having pulse widths corresponding to the levels of the above output signals. The pulse signals thus obtained as a result of the above conversion are simultaneously supplied to each input terminal of the multiplexer 15, for every horizontal scanning period.

The above described signal processing is similarly performed with respect to a right channel (R-channel) signal applied to an input terminal 11b. That is, signals obtained from narrow-bandpass filters 12b1 through 12bn and a full-bandpass filter 12bm are respectively rectified and smoothened at rectifying and smoothing circuits 13b1 through 13bn and 13bm, and supplied to the multiplexer 15 after being subjected to pulse width conversion at comparators 14b1 through 14bn and 14bm. Here, because the movable contact of the switch S5 is grounded, a capacitor C of the rectifying and smoothing circuits 13b1 through 13bn and 13bm respectively having a construction shown in FIG. 6 continues to be discharged, and the outputs of the filters 12b1 through 12bn and 12bm are rectified and smoothened. On the other hand, the movable contact of the switch S6 is connected to the terminal a. Thus, a transistor Q of differentiating circuits $19_1$ through $19_n$ and $19_m$ respectively having a construction shown in FIG. 7 is turned ON when applied with a power source voltage +V. Accordingly, the outputs of the comparators 14b1 through 14bn and 14bm are supplied to the multiplexer 15 as they are.

The multiplexer 15 is simultaneously supplied with a signal p shown in FIG. 4(A) in synchronism with a vertical synchronizing signal Vs within the video signal shown in FIG. 4(H) and signals q0 through q3 shown in FIGS. 4(B) through 4(E), to a decoding signal input terminal in parallel, from the synchronizing pulse generator 17. The signals q0 through q3 are obtained by successively frequency-dividing the signal p. By the combination of the above signals p and q0 through q3, a vertical scanning direction switching signal is obtained with a predetermined interval. The signals applied to the input terminals of the multiplexer 15 are successively subjected to time division during the vertical scanning period by the above switching signal, and accordingly obtained serially.

For example, observation will first be made with respect to the full-band signal of the L-channel displayed at the upper end of the screen of the picture tube 18. When a pulse signal shown in FIG. 5(C) is obtained from the comparator 14am, this pulse signal is gated for a predetermined interval (low-level period of the pulse q0) with a timing corresponding to the vertical direction display position of the full-band signal in the L-channel, by the switching signal from the synchronizing pulse generator 17. For example, the display period for the vertical direction corresponds to the pulse width (corresponding to ten horizontal scanning lines, for example) of the pulse q0. The pulse signal thus gated, is accordingly obtained from the multiplexer 15. This signal from the multiplexer 15 is supplied to the picture tube 18, through an adding gate 16. The signal obtained through the adding gate 16, is added with the vertical synchronizing signal Vs and the horizontal synchronizing signal Hs supplied from the input terminal 20, and formed into the composite video signal. A bar $21_L$ is hence displayed on the screen of the picture tube 18. Description will be given hereinafter on why there is no display on the left side of the bar $21_L$.

In the above case, the timing with which the switching signal corresponding to the full-band signal in the L-channel is generated, does not correspond to the vertical direction display position which corresponds to other spectral signals. Hence, all the other spectral signals are not displayed, even if pulse signals corresponding to other spectral signals are supplied to the other input terminal of the multiplexer 15. Similarly, the pulse signal from the comparator 14bm is gated by the switching signal from the synchronizing signal generator 17 for a predetermined interval (high-level period of the pulse q0), with a timing corresponding to the vertical direction display position of the full-band signal in the R-channel. As a result, a bar $21_R$ is displayed on the screen of the picture tube 18 as shown in FIG. 3, as in the case of the above L-channel.

The pulse signal from the synchronizing signal generator 17 is supplied to the base of a transistor Q2. This transistor Q2 is turned ON during the high-level period of the pulse q0. Accordingly, during the low-level period of the pulse q0, the L-channel signal obtained from the multiplexer 15 is passed through a variable resistor VR, diode D, and resistor R and formed into a relatively high voltage. This relatively high voltage is supplied to the adding gate 16. On the other hand, during the high-level period of the pulse q0, the R-channel signal obtained from the multiplexer 15 is voltage-divided at the variable resistor VR and formed into a voltage lower than the above L-channel signal. The R-channel signal is then supplied to the adding gate 16, through the diode D and resistor R. Therefore, the bar $21_L$ of the L-channel signal is displayed with a greater brightness compared to the bar 12R of the R-channel signal.

The above described operation is repeatedly performed by the switching signal from the synchronizing signal generator 17. The outputs of the comparators supplied in parallel to each input terminal of the multiplexer 15, are serially obtained with a timing corresponding to the vertical direction display position, and supplied to the picture tube 18. Thus, the audio signal level is displayed on the screen of the picture tube 18 is shown in FIG. 8C. In this case, the L-channel signal level and the R-channel signal level are displayed side by side for each of the frequency bands, and it is easy to read out the level difference between the channels. Moreover, the switching signal from the synchronizing pulse generator 17 is set so that there is a space between the bar $21_R$ of the full-band signal and a bar $21_{40L}$ of the L-channel signal at 40 Hz in the display. Accordingly, it is easy to discriminate the full-band signal and the spectral signals.

The above multiplexers are constructed from TTL. Accordingly, series conversion can be performed with a high speed. For example, compared to a case where a C-MOS multiplexer is used, high resolution can be obtained, and the bar display becomes clear and sharp. Therefore, it is sufficient to provide a memory of a small memory capacity in only a character display system which will be described hereinafter, and a memory is not required in a spectral display system.

Besides the above spectral display on the screen of the picture tube 18 by the above bars, character display is also made to indicate the frequencies, decibels, and the like as will be described hereinafter. Hence, in order to prevent the bars and the characters from overlapping, it becomes necessary to provide a part for the character display on the screen of the picture tube 18. Accordingly, a signal shown in FIG. 4(F) for blanking the bars in a first row part Bc1 for characters displayed on the screen of the picture tube 18 including the vertical blanking part, and a signal shown in FIG. 4(G) for blanking the bars in a lowermost row part Bc2 for characters displayed on the screen of the picture tube 18 including the vertical blanking part, are respectively supplied to the multiplexer 15 from the blanking signal generator 19. On the other hand, a signal shown in FIGS. 5(D) for blanking the bars in a left part $B_{H1}$ and a right part $B_{H2}$ respectively corresponding to four rows of characters including the vertical blanking part on the screen of the picture tube 18, are also supplied to the multiplexer 15 from the blanking signal generator 22.

Therefore, bar display outside the display dynamic range (levels exceeding +10 dB and levels under −30 dB), display of a crosstalk signal introduced due to shifted timing of the decoding signals at the multiplexer 15 (indications 21a and 21b shown in FIG. 8C, for example) and the like are subjected to the blanking, and are not displayed on the screen of the picture tube 18.

On the other hand, the RAM 24 is operated by the control signal from the CPU 23. The RAM 24 stores thirty-two columns by sixteen rows of characters (alphabets, numerals, signs such as "+", "−", "( )", and the like) on the screen of the picture tube 18, and positions of where the characters are to be displayed on the screen of the picture tube 18. A command signal indicating a predetermined character and its position is obtained from the RAM 24 and supplied to the character generator 25.

The character generator 25 comprises a memory corresponding to a dot matrix of the characters, numerals, and the like. Hence, binary codes corresponding to predetermined characters are produced in parallel from the memory of the character generator 25, according to the command signal supplied thereto from the RAM 24. The parallel signal in accordance with the command signal from the RAM 22 thus obtained from the character generator 25, is supplied to a parallel-to-serial (parallel/serial) converter 26. The above CPU 23, RAM 24, character generator 25, and parallel/serial converter 26, are synchronously operated by an address signal from the synchronizing pulse generator 17.

The parallel signal from the character generator 25 is converted into a serial signal capable of scanning in the vertical and horizontal directions on the screen of the picture tube 18, by the address signal from the synchronizing pulse generator 17, at the parallel/serial converter 26. The character indication signal converted into a serial signal at the parallel/serial converter 26, is supplied to the picture tube 18 through the adding gate 16. As a result, characters "FREQUENCY (Hz)", "SPECTRUM ANALYZER", and the like, and numerals "40", "150", "+10", and the like, are displayed on the screen of the picture tube 18 as shown in FIG. 8B. These characters and numerals are displayed on the screen of the picture tube 18 at the above bar blanking parts, that is, at the first row part Bc1, the lowermost row part Bc2, and the left part $B_{H1}$. The spectral indication signal from the multiplexer 15 and the character indication signal from the parallel/serial converter 26 are added at the adding gate 16. Accordingly, the spectral display by bars and character display shown in FIG. 8A are simultaneously obtained on the screen of the picture tube 18. In this case, as shown in FIG. 8C, a starting point $21_1$ of a bar and a termination point $21_2$ of a bar do not overlap with the characters and numerals because the above blanking parts are provided on the screen of the picture tube 18. In addition, because a character generator is provided in the character display system, the memory (character memory) capacity required for one picture may be small.

On the other hand, when holding and displaying the maximum value of the input signal, the movable contacts of the switches S1 through S6 are respectively connected to terminals b. The L-channel signal and the R-channel signal respectively applied to the input terminals 11a and 11b, are supplied to an adder 27 through the switches S1 and S2. The L-channel signal and the R-channel signal are added at the adder 27 and substantially formed into a monaural signal. This monaural signal is supplied to the narrow-bandpass filters 12a1 through 12an, 12b1 through 12bn, 12am and 12bm through the switches S3 and S4, and subjected to frequency-division. Spectral signals and full-band signals are thus obtained. The signals obtained from the filters 12a1 through 12an and 12am are rectified and smoothened at the rectifying and smoothing circuits 13a1 through 13an and 13am, and then supplied to the comparators 14a1 through 14an and 14am. The signals supplied to the comparator 14 are formed into pulse signals having pulse widths corresponding to the signal levels as in the case of the above described real-time display, and then supplied to the multiplexer 15.

On the other hand, the signals obtained from the filters 12b1 through 12bn and 12bm are rectified and smoothened at the rectifying and smoothing circuits 13b1 through 13bn and 13bm. Greater levels of the signals at the rectifying and smoothing circuits 13b1 through 13bn and 13bm are successively held, and supplied to the comparators 14b1 through 14bn and 14bm. That is, because the movable contact of the switch S5 is connected to the terminal S5, the capacitor C shown in FIG. 6 successively charges the incoming signal. Hence, a higher voltage is held at the terminal of the capacitor C. The output signals of the rectifying and smoothing circuits 13b1 through 13bn and 13bm are supplied to the comparators 14b1 through 14bn and 14bm. As a result, pulse signals having pulse widths corresponding to the signal levels are produced from the comparators 14b1 through 14bn and 14bm, and supplied to the differentiating circuits $19_1$ through $19_n$.

Observation will now be made on the real-time display of the full-band signal, for example. A signal obtained by adding the L-channel signal and the R-channel signal, is obtained from the comparator 14am. Thus, as in the above described case where the level of the channels are displayed independently, a real-time level bar $21_F$ is displayed on the screen of the picture tube 18 as shown in FIG. 9. Because the above signal is obtained from the comparator 14am, the bar $21_F$ is displayed at the display position of the L-channel signal upon independent real-time display of the channel. On the other hand, when obtaining the maximum value hold display, a pulse signal shown in FIG. 5(G), for example, obtained by adding the L-channel signal and the R-channel signal and holding the maximum value, is supplied to the differentiating circuit $19_m$ from the comparator 14bm. Here, because the movable contact of the switch S6 is connected to the terminal b, a transistor Q1 shown in FIG. 7 becomes turned OFF. The pulse signal shown in FIG. 5(G) obtained from the comparator 14bm is differentiated at a capacitor C1 and a resistor R1, and formed into a pulse shown in FIG. 5(H) having a small pulse width. This pulse is supplied to the multiplexer 15 and displayed as a maximum value hold level bar $21_H$ on the screen of the picture tube 18, similarly as in the case of the above independent real-time display of the channels. Because the above signal is obtained from the comparator 14bm, the bar $21_H$ is displayed at the display position of the R-channel signal upon independent real-time display of the channel.

As in the case of the independent real-time display of the channels, the above bars $21_F$ and $21_H$ are displayed with the duration of the vertical direction pulse q0. The maximum value hold level bar $21_H$ is displayed with greater brightness compared to the real-time level bar $21_F$. If the bars $21_F$ and $21_H$ are to be displayed with the same brightness, the output of the multiplexer 15 is directly supplied to the adding gate 16 in FIG. 2.

The spectral signals in other frequency bands are similarly displayed, that is, real-time level bars and maximum value hold level bars are displayed as shown in FIG. 10. In this case, because the channels are not displayed independently, characters "FULL" are displayed at parts corresponding to two upper bars as shown in FIG. 10, by the control signal from the CPU 23.

As described above, according to the present embodiment of the invention, the real-time display mode shown in FIG. 8A for displaying the spectral signals independently for each channel, and the display mode for displaying the spectral signals in real-time and displaying the maximum values of the spectral signals, can be obtained according to the needs by a simple switching operation. Hence, the device is especially useful when carrying out recording according to the various needs.

In the present embodiment of the invention, the monaural signal obtained by adding the L-channel signal and the R-channel signal is used during the display mode for displaying the spectral signals in real-time and displaying the maximum values of the spectral signals. However, switches having three terminals wherein one of the three terminals is free, may be used for the switches S1 and S2, for example. In this case, if the arrangement is such that the switch S2 (S1) is connected to the free terminal when the movable contact of the switch S1 (S2) is connected to the terminal b, the real-time display of the spectral signal and the maximum value of the spectral signal in either the L-channel or the R-channel can be displayed selectively.

In addition, although both the R-channel and the L-channel are displayed in the present embodiment of the invention, only one channel can be displayed instead. Moreover, a plurality of channels over two may be displayed. Furthermore, it may not be necessary to display the full band.

The signal supplied to the input terminal 11 in FIG. 1 may be a signal which is passed through a transmission path comprising an equalizing amplifier and the like, and varied of its frequency characteristic. Further, the signal before being varied of the frequency characteristic and the signal varied of the frequency characteristic may both be supplied to the input terminal 11 for display.

In the present embodiment, the blanking parts Bc1 and Bc2 in the vertical direction are provided for blanking the bars. However, if the indications 21a and 21b of the crosstalk signals are not generated in FIG. 8C, it is not essential to provide these blanking parts Bc1 and Bc2. According to the characteristic of the input signal, the bar display may have to possess priority over the measure taken to prevent unwanted overlapping display of the characters and the bars. That is, if the dynamic range of the display is to be set to a value greater than +10 dB, for example, it is not essential to provide the blanking part $B_{H2}$.

Instead of using the above character generator 25, the CPU 23 and the RAM 24 may be used to produce signals corresponding to predetermined characters.

In the present embodiment, it is possible to change and re-write the characters and the like, because the above described CPU 23, RAM 24, and character generator 25 are used. However, the level display device according to the present invention is not limited to the above system, and may employ a system which uses a read only memory (ROM) and cannot change and re-write the characters and the like. In addition, a system may be employed wherein a ROM 30 and the RAM 24 are used together as shown in FIG. 11.

The quantity of characters to be stored in the RAM 24 is not limited to the above thirty-two columns by sixteen rows, and may be a larger quantity.

Further, the multiplexer 15 is not limited to being switched by use of the 5-bit signal formed from the decoding signals p and q0 through q3. That is, switches may be switched by signals obtained in time division from these switches.

The method for providing the blanking parts of the bars is not limited to the above described method wherein the multiplexer 15 is strobed and controlled. For example, a circuit for gating and controlling the outputs of the multiplexer may be provided between the multiplexers and the adding gate 16. Moreover, when providing the blanking parts along the horizontal direction of the bars, a voltage which decreases (or increases) with time only during an interval excluding the blanking parts ($B_{H1}$, $B_{H2}$) as shown in FIG. 5(B) may be used as the comparison voltage which is applied to the input terminal $14_0$ shown in FIG. 2.

The video signal is not limited to black-and-white video signal, and may be a color video signal. If the video signal is a color video signal, a color video signal generator is provided at the output stage of the adding gate 16. In addition, the L-channel signal bar $21_L$ and the R-channel signal bar $21_R$ shown in FIG. 3, and the real-time display bar $21_F$ and the maximum value hold display bar $21_H$ shown in FIG. 9, may be displayed with respectively different brightness by use of the above voltage difference.

In the above embodiment, the differentiating circuits $19_1$ through $19_n$ and $19_m$ are provided so as to display only the tip ends of the maximum value hold level bar. However, monostable multivibrators may be used instead of the differentiating circuits. However, when substituting the differentiating circuits by the monostable multivibrators, a circuit must be provided additionally for switching the direct outputs of the comparators and the outputs of the monostable multivibrators.

Furthermore, in the above embodiment, the rectifying and smoothing circuit 13 is used as a logarithmic converting means, in order to obtain digital display of the input signal. But instead of performing the logarithmic conversion at the rectifying and smoothing circuit 13, a circuit for subjecting a sawtooth wave voltage to logarithmic conversion, may be connected between the comparator 14 and a circuit which generates a sawtooth wave voltage shown in FIG. 5(A).

Moreover, instead of dividing the input signal into different frequency bands and obtaining the spectral display of the signal level for the respective bands, the input signal level of a plurality of channels may be displayed independently for each channel.

If the above differentiating circuits are provided in parallel with the comparators 14a1 through 14an and 14am, the real-time level can be displayed by small bars equal to the maximum value hold level bars.

Next, description will be given with respect to a second embodiment of a level display device according to the present invention, by referring to FIG. 12. In FIG. 12, those parts which are the same as those corresponding parts in FIG. 2 are designated by the same reference numerals, and their description will be omitted.

The signal divided of the frequency band at the filters 12a1 through 12an and 12am and 12b1 through 12bn and 12bm, are supplied to volume unit level detectors (VU level detectors) 40a1 through 40an and 40am and 40b1 through 40bn and 40bm, and to maximum value hold circuits 41a1 through 41an and 41am and 41b1 through 41bn and 41bm. The VU level detectors 40a1 through 40an and 40am and 40b1 through 40bn and 40bm substantially have the same function as the rectifying and smoothing circuits 13a1 through 13an and 13am shown in FIG. 2. On the other hand, the maximum value hold circuits 41a1 through 41an and 41am and 41b1 through 40bn and 40bm substantially have the same function as the rectifying and smoothing circuits 13b1 through 13bn and 13bm when the movable contact of the switch S5 is connected to the terminal b.

Signals detected of the levels at the VU level detectors 40a1 through 40an and 40am and 40b1 through 40bn and 40bm are respectively supplied to comparators 42a1 through 42an and 42am and 42b1 through 42bn and 42bm and compared with a comparison voltage shown in FIG. 3(A). Pulse signals in accordance with the signal levels thus obtained from these comparators 42a1 through 42an and 42am and 42b1 through 42bn and 42bm are supplied to a VU-system multiplexer $15_V$. On the other hand, signals held of the maximum values at the maximum value hold circuits 41a1 through 41an and 41am and 41b1 through 41bn and 41bm are respectively supplied to comparators 43a1 through 43an and 43am and 43b1 through 43bn and 43bm. As in the VU-system, pulse signals in accordance with the signal levels, are thus obtained from the comparators 43a1 through 43an and 43am and 43b1 through 43bn and 43bm. The pulse signals from the comparators 43a1 through 43an and 43am and 43b1 through 43bn and 43bm are respectively differentiated at differentiating circuits 44a1 through 44an and 44am and 44b1 through

44$bn$ and 44$bm$, and then supplied to a maximum value system multiplexer 15$_H$. The decoding signals p and q0 through q3 are supplied to the multiplexers 15$_V$ and 15$_H$ from the synchronizing pulse generator 17. The input signals to the multiplexers 15$_V$ and 15$_H$ are serially obtained from these multiplexers for each of the frequency bands, with a timing of the pulse q0. The signals thus serially obtained are supplied to an OR-gate 45.

If only the real-time level is to be displayed, a switch S7 is opened. In this state, only the output signal of the multiplexer 15$_V$ is obtained through the OR-gate 45. As shown in FIG. 8A, the full-band signal and the spectral signals are displayed side by side for the L-channel and the R-channel, with a difference in brightness therebetween.

On the other hand, when displaying the real-time level and the maximum value level, the switch S7 is closed. In this state, the output signals of the multiplexers 15$_V$ and 15$_H$ are respectively obtained through the OR-gate 45. As clearly understood from the operation described above for the case where the movable contacts of the switches S1 and S6 are connected to the terminals b, the real-time display bars 21$_L$ and 21$_R$ and the maximum value display bars 21$_{LH}$ and 21$_{RH}$ can be displayed independently for the L-channel and the R-channel with difference in brightness, as shown in FIG. 13.

As described above, according to the second embodiment of the invention, the display mode can be switched between the real-time display mode and the real-time display and maximum value display mode, to independently obtain the display for each of the channels.

In the present embodiment, the display is obtained for both the L-channel and the R-channel. However, a plurality of channels over two may be displayed. Further, the display need not necessarily be for the full band.

Next, description will be given with respect to a third embodiment of a level display device according to the present invention. In FIG. 14, those parts which are the same as those corresponding parts in FIG. 1 are designated by the same reference numerals, and their description will be omitted. Similarly, in FIG. 15, those parts which are the same as those corresponding parts in FIG. 12 are designated by the same reference numerals, and their description will be omitted. In FIG. 15, peak level detectors 50$a1$ through 50$an$ and 50$am$ and 50$b1$ through 50$bn$ and 50$bm$ respectively have a rising time of 12 ms and a falling time of 1.5 s, for example. The maximum value hold circuits 41$a1$ through 41$an$, 41$am$, 41$b1$ through 41$bn$, and 41$bm$ are constructed from analog-to-digital (A/D) converters, digital value hold circuits, and digital-to-analog (D/A) converters. Accordingly, the above maximum value holding circuits respectively converts the signal from the filter into a digital value, successively holds the greater peak level of the digital signal, and converts the held digital value into the original analog value. The peak level and the maximum value hold level of the input signal in the L-channel are respectively detected at the peak level detectors 50$a1$ through 50$an$ and 50$am$, and the maximum value hold circuits 41$a1$ through 41$an$ and 41$am$, and respectively supplied to a peak system analog multiplexer 15$_P$ and the maximum value system analog multiplexer 15$_H$.

The above described signal processing operation is also performed with respect to the R-channel signal supplied to the input terminal 11$b$.

The signal p shown in FIG. 4(A) and the signals q0 through q3 shown in FIGS. 4(B) through 4(E) are simultaneously supplied in parallel to input terminals of the multiplexers 15$_P$ and 15$_H$ from the synchronizing pulse generator 17. The multiplexers 15$_P$ and 15$_H$ respectively switch the signals from the peak level detectors 50$a1$ through 50$bm$ and the signals from the maximum value hold circuits 41$a1$ through 41$bm$ which are simultaneously supplied to the respective input terminals of the multiplexers 15$_P$ and 15$_H$ with the duration of the pulse q0, that is, an interval corresponding to ten horizontal scanning lines, for example, by a switching signal obtained by combining bits of the decoding signals p and q0 through q3. Accordingly, signals are obtained serially from output terminals of these multiplexers 15$_P$ and 15$_H$ with a timing corresponding to each vertical direction display position of the respective spectral signal. In this case, because the decoding signals are supplied to the multiplexers 15$_P$ and 15$_H$ in parallel from the synchronizing pulse generator 17, the peak level signal and the maximum value hold signal in one frequency band are simultaneously obtained from the multiplexers 15$_P$ and 15$_H$.

The peak level signal and the maximum value hold signal respectively obtained from the multiplexers 15$_P$ and 15$_H$, are subjected to logarithmic compression in correspondence with with the decibel level display at logarithmic converters 51$_P$ and 51$_H$. Outputs of the logarithmic converters 51$_P$ and 51$_H$, are respectively supplied to one of the input terminals 52$_O$ of comparators 52$_P$ and 52$_H$. The comparison voltage shown in FIG. 5(A) is applied to the other input terminals of the comparators 52$_P$ and 52$_H$ from the synchronizing signal generator 17. Accordingly, the output signals of the logarithmic converters 51$_P$ and 51$_H$ are respectively compared with the above comparison voltage, and the comparators 52$_P$ and 52$_H$ respectively produce pulse signals having pulse widths in accordance with the output signal levels.

For example, observation will be made with respect to the peak level signal and the maximum value hold signal in the L-channel of the full-band signal. A case will be assumed where a pulse signal shown in FIG. 5C which is in accordance with the peak level, and a pulse signal shown in FIG. 5(G) which is in accordance with the maximum value hold level, are simultaneously obtained from the comparator 52$_P$. In this case, the signal obtained from the comparator 52$_H$ is formed into a pulse signal shown in FIG. 5(H) having a small pulse width at the monostable multivibrator 53. The pulse signal from the monostable multivibrator 53 and the output signal of the comparator 52$_P$ are both supplied to the OR-gate 45. The OR-gate 45 accordingly adds the outputs of the comparator 52$_P$ and the monostable multivibrator 53, and supplies the added signal to the picture tube 18 through the adding gate 16. Hence, as shown in FIG. 16, a peak bar 21$_{LP}$ (longitudinal display) and a maximum value bar 21$_{LH}$ (positional display) are respectively displayed on the screen of the picture tube 18. At the same time, the signals from the peak level detector 50$bm$ and the maximum value hold circuit 41$bm$ are gated for a predetermined interval (high-level period of the pulse q0), by the switching signal from the synchronizing pulse generator 17, with a timing corresponding to the vertical direction display position of the full-band signal in the R-channel. The signals thus gated, are supplied to the comparators 52$_P$ and 52$_H$ wherein the gated signals are converted into pulse signals having pulse widths and generation timings in accordance with the signal levels. As in the case of the above L-channel display, a peak bar $21_{RP}$ and a maximum bar $21_{RH}$ are displayed on the screen of the picture tube 18 as shown in FIG. 16.

In the above case, as in the first embodiment of the invention, the bars $21_{LP}$ and $21_{LH}$ of the L-channel are displayed with greater brightness compared to the bars $21_{RP}$ and $21_{RH}$ of the R-channel.

Figure 17A:
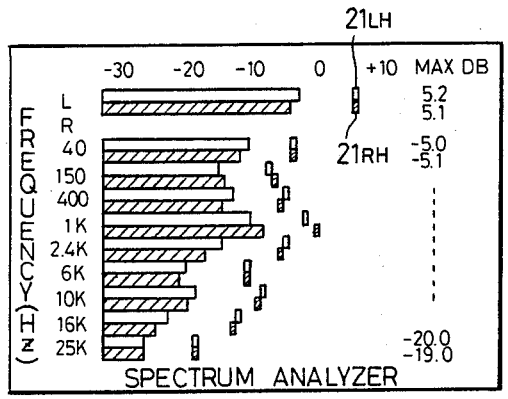
FIGS. 17A, 17B, and 17C respectively show display patterns obtained by the circuit shown in FIG. 15.
Figure 17B:
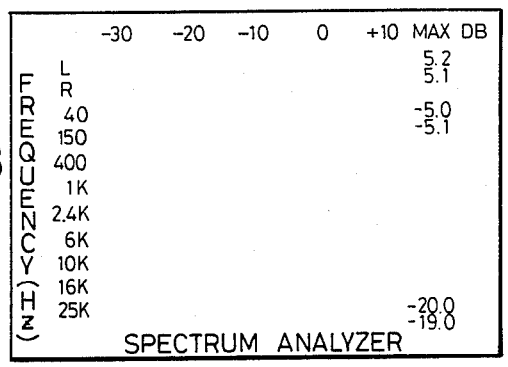
Figure 17C:
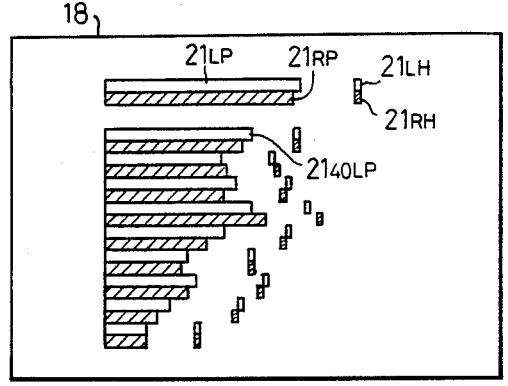

The spectral signals applied to the input terminals of the multiplexers $15_P$ and $15_H$ in parallel, are serially obtained with a timing corresponding to the vertical direction display position, and displayed on the screen of the picture tube 18 as shown in FIG. 17C. In this case, because the L-channel and the R-channel are displayed side by side for each of the frequency bands, it is easy to visually compare the level differences. In addition, dead terminals $15_{P0}$ and $15_{H0}$ are provided at the input terminals of the multiplexers $15_P$ and $15_H$. As a result, a space is formed between the bar $21_{RP}$ of the full-band signal and a bar $21_{40LP}$ at 40 Hz. It is thus easy to discriminate the full-band signal and the spectral signals. Instead of providing the above dead terminals, measures may be taken so that the switching signal from the synchronizing pulse generator 17 is not obtained at the part corresponding to the above space.

As clearly seen from FIG. 15, in the present embodiment of the invention, the output signals of the peak level detectors $50a1$ through $50bm$ and the maximum value hold circuits $41a1$ through $41bm$ are serially obtained through the multiplexers $15_P$ and $15_H$ with a timing corresponding to the vertical direction display position. The serially obtained signals are then converted into pulse signals having pulse widths in accordance with the signal levels at the comparators $52_P$ and $52_H$. Hence, it is not necessary to provide the comparators for each output of the peak level detectors $50a1$ through $50bm$ and the maximum value hold circuits $41a1$ through $41bm$ to convert the signals into pulse signals having pulse widths in accordance with the signal levels for obtaining signals serially from the multiplexers. According to the present embodiment, it is only necessary to provide one comparator for the peak level system and the maximum value hold system.

On the other hand, the output of the comparator $52_P$ is supplied to the counter 54. The counter 54 is driven by the control signal from the CPU 23 used for character display. The counter 54 successively holds and reads the number of clock pulses corresponding to the pulse signal of a larger pulse width obtained from the comparator $52_P$, for each of the spectral signals. That is, the number of clock pulses corresponding to the maximum value hold level detected at the maximum value hold circuits $41a1$ through $41bm$, is substantially read out. The number of clock pulses corresponding to the maximum value hold level thus read out, is supplied to the CPU 23 and written into the RAM 24 shown in FIG. 14. As in the case of the above described character display, the output of the RAM 24 is supplied to the character generator 25 and the parallel/serial converter 26. The numeral indication signal thus obtained from the parallel/serial converter 26 is then supplied to the picture tube 18. As a result, numerical values corresponding to the maximum value hold levels, that is, "5.2" and "5.1", for example, are displayed at parts not interfering with the display of the maximum value hold level bars $21_{LH}$ and $21_{RH}$ as shown in FIG. 17B.

The above peak level display, maximum value hold level bar display, and maximum value hold numerical value display are similarly carried out with respect to the other spectral signals.

The output signals of the pulse width converter 52 and the parallel/serial converter 26 are added at the adding gate 16, and as shown in FIG. 17A, the bars, characters, and numerals are composed and displayed on the screen of the picture tube 18. Besides displaying the peak level and the maximum value hold level by the bars, the maximum value hold level is displayed by numerical values. Thus, reading of the signal level is facilitated.

On the other hand, the output of the adding gate 16 is supplied to a video printer 55. Hence, it is possible to immediately print especially the numerals corresponding to the maximum value hold levels ("5.2" and "5.1", for example) and the bars on a suitable printing sheet. When setting a recording level with respect to other recording mediums such as a disc and tape, such a printed recording of the maximum value hold level becomes useful.

In the present embodiment of the invention, the peak level and the maximum value hold level are displayed by the bars. However, the display is not limited to the above, and for example, VU level detectors may be used to display the VU level and the maximum value hold level by the bars.

Figure 18:
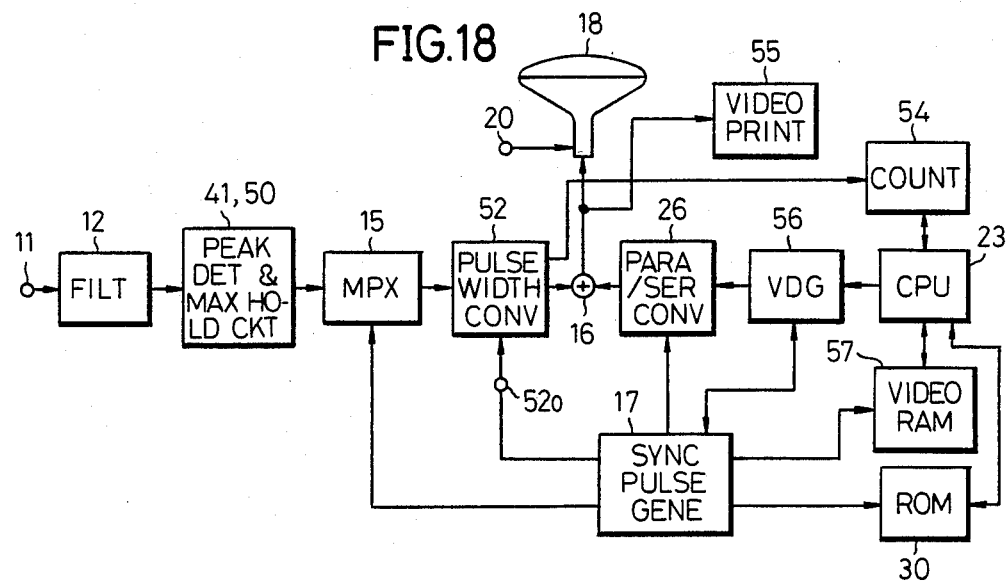
FIG. 18 is a general systematic block diagram showing a modification of the third embodiment of the level display device according to the present invention.

Next, description will be given with respect to a fourth embodiment of a level display device according to the present invention. In FIG. 18, those parts which are the same as those corresponding parts in FIG. 14 are designated by the same reference numerals, and their description will be omitted. Similarly, in FIG. 19, those parts which are the same as those corresponding parts in FIG. 15 are designated by the same reference numerals, and their description will be omitted.

In the present embodiment, the peak level and the VU level (average level of the input signal) are displayed on a single bar with a difference in brightness therebetween. In addition, the maximum value hold level of the peak level and the maximum value hold level of the VU level are displayed at positions corresponding to the respective bars with a difference in brightness therebetween. Furthermore, the respective maximum value hold levels are displayed by numerical values.

In order to simplify the explanation, description will be given with respect to the spectral signals of the L-channel at 15 kHz. The output signal of the peak level detector $50an$ is supplied to a peak system analog multiplexer $15_{P1}$, and also supplied to the maximum value hold circuit $41an$. The larger level of the signal thus supplied to the maximum value hold circuit $41an$ is held and supplied to a peak maximum value system analog multiplexer $15_{P2}$. The signals supplied to the multiplexers $15_{P1}$ and $15_{P2}$ are serially obtained by the switching signal from the synchronizing pulse generator 17, and supplied to logarithmic converters $51_{P1}$ and $51_{P2}$ wherein the signals are subjected to logarithmic conversion as in the above described embodiment.

The L-channel signals at 15 kHz which are obtained from the logarithmic converters $51_{P1}$ and $51_{P2}$ are compared with the comparison voltage at comparators $52_{P1}$ and $52_{P2}$, similarly as in the above embodiment. A pulse signal having a pulse width corresponding to the peak level, is obtained from the comparator $52_{P1}$ and supplied to an OR-gate $45_P$. On the other hand, a pulse signal having a pulse width corresponding to the maximum value hold level, is obtained from a monostable multivibrator 53$_P$ and supplied to the OR-gate 45$_P$.

The signal obtained from the filter 12an is supplied to a VU level detector 60an having a rising time and a falling time respectively equal to 300 ms, for example, wherein the average level (VU level) is detected. An output signal of the VU level detector 60an is supplied to a VU system analog multiplexer 15$_{H1}$. On the other hand, the output signal of the VU level detector 60an is supplied to a maximum value hold circuit 61an wherein the maximum value of the VU level is held. An output signal of the maximum value hold circuit 61an is supplied to a VU maximum value system analog multiplexer 15$_{H2}$. Similarly as in the signal in the above peak system, a pulse signal having a pulse width corresponding to the VU level is obtained from a comparator 52$_{H1}$, and supplied to an OR-gate 54$_H$. On the other hand, a pulse signal having a pulse width corresponding to the maximum value hold level is obtained from a monostable multivibrator 53$_H$, and supplied to the OR-gate 54$_H$.

Figure 20:
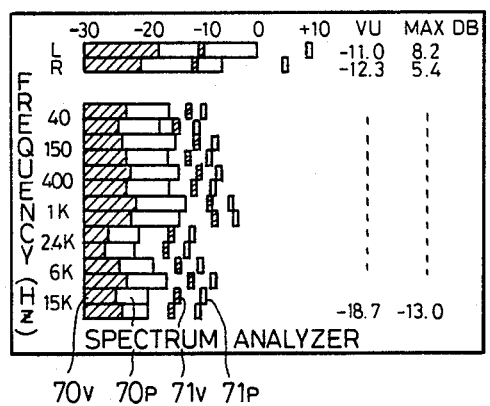
FIG. 20 shows a display pattern obtained by the circuit shown in FIG. 19.

During the interval in which the signal corresponding to the VU level is obtained from the OR-gate 54$_H$ and the signal corresponding to the peak level is obtained from the OR-gate 54$_P$, these signals are added through resistors R11 and R12. Accordingly, the voltage (VU level) obtained through the diode D1 and the transistor Q is relatively high. On the other hand, during the interval in which the signal corresponding to the peak level is obtained from the OR-gate 54$_H$ and no signal is obtained from the OR-gate 54$_P$, the voltage obtained through the transistor Q during this peak level display is lower than the voltage upon VU level display. Thus, as shown in FIG. 20, a VU level bar 70$_V$ is displayed with a greater brightness than a peak level bar 70$_P$. As in the above described embodiment, the signals obtained from the monostable multivibrators 53$_P$ and 53$_H$ are respectively displayed as a peak maximum level bar 71$_P$ and a VU maximum value hold level bar 71$_V$.

A control signal from a video display generator (VDG) 56 is supplied to the synchronizing pulse generator 17, and the synchronizing pulse generator 17 accordingly produces the synchronizing pulse. Hence, the character indication signal for obtaining the display shown in FIG. 17B is read out from the ROM 30 by the above synchronizing signal, and supplied to the VDG 56 through the CPU 23. The output signal of the VDG 56 is formed into a serial signal at the parallel/serial converter 26, and then supplied to the picture tube 18. On the other hand, the counter 54 counts the clock pulses according to the pulse widths respectively corresponding to the peak system maximum value hold level and the VU system maximum value hold level. The numerical value indication signal stored in a video RAM 57 is read out by the signal from the counter 54, and supplied to the VDG 56. As a result, a peak maximum value "−13.0" and a VU maximum value "−18.7" are displayed as shown in FIG. 20, for example.

Similarly, the peak level, VU level, peak maximum value level, and VU maximum value level of the other spectral signals can be displayed by bars, and the peak maximum value and VU maximum value level can be displayed by numerals, respectively.

The above display of the numerical values is not limited to the display of the maximum value hold level and the VU maximum value level. That is, numerical values may be displayed for indicating real-time level such as the peak level.

Further, the present invention is not limited to these embodiments, but various variations and modifications may be made without departing from the scope of the present invention.

What is claimed is:

1. A display device comprising:
    a plurality of bandpass filters having filtering bands of respectively different center frequencies, for band-dividing and filtering an input audio signal supplied thereto through an input terminal;
    synchronizing signal generating means for generating a horizontal synchronizing signal, a vertical synchronizing signal, and synchronizing pulses;
    level indication signal producing means supplied with output signals of said bandpass filters, for converting the thus supplied output signal into a signal in synchronism with the horizontal synchronizing signal from the synchronizing signal generating means and having a pulse width in accordance with the level of the horizontal synchronizing signal, and serially obtaining the converted signal in synchronism with the vertical synchronizing signal from the synchronizing signal generating means by successive time-division carried out during a vertical scanning period;
    character indication signal producing means stored with information signals for displaying characters and the like, for serially obtaining a character indication signal in synchronism with the synchronizing pulses from the synchronizing signal generating means;
    composing means driven by said synchronizing signals from the synchronizing signal generating means, for obtaining a video signal by composing an output of said level indication signal producing means and an output of said character indication signal producing means; and
    a picture tube,
    said display device composing and displaying bars in a horizontal direction corresponding to the audio signal level, characters, and the like, on the picture tube, by the outputs of said composing means.

2. A level display device as claimed in claim 1 in which said synchronizing signal generating means further generates a comparison voltage which is in synchronism with the horizontal synchronizing signal and successively varying in voltage level with time during a horizontal scanning period, said level indication signal producing means comprises a plurality of comparators respectively supplied with respective output signals of said bandpass filters to one input terminal thereof and supplied with said comparison voltage from said synchronizing signal generating means to the other input terminal thereof.

3. A level display device as claimed in claim 1 in which said characters are numerals and signs for displaying frequency bands, channel numbers, and a level scale, and characters for displaying units of the frequency bands and levels and for displaying their respective axes.

4. A display device comprising:
    a plurality of bandpass filters having filtering bands of respectively different center frequencies, for band-dividing and filtering an input audio signal supplied thereto through an input terminal;

synchronizing signal generating means for generating a horizontal synchronizing signal, a vertical synchronizing signal, synchronizing pulse, and a vertical blanking signal;

level indication signal producing means supplied with output signals of said bandpass filters, for converting the thus supplied output signal into a signal in synchronism with the horizontal synchronizing signal from the synchronizing signal generating means and having a pulse width in accordance with the level of the horizontal synchronizing signal, and serially obtaining the converted signal in synchronism with the vertical synchronizing signal from the synchronizing signal generating means by successive time-division carried out during a vertical scanning period;

blanking means supplied with the level indication signal from the level indication signal producing means and the vertical blanking signal from the synchronizing signal generating means to block production of the level indication signal during a predetermined interval;

character indication signal producing means stored with information signals for displaying characters and the like, for serially obtaining a character indication signal in synchronism with the synchronizing pulses from the synchronizing signal generating means;

composing means driven by said video signal synchronizing signals from the synchronizing signal generating means, for obtaining a video signal by composing an output of said level indication signal producing means and an output of said character indication signal producing means; and a picture tube, said display device composing and displaying parts of bars in a horizontal direction corresponding to the audio signal level, characters, and the like, on the picture tube, by the outputs of said composing means, the remaining parts of bars being erased by said blanking means.

5. A display device comprising:

a plurality of bandpass filters having filtering bands of respectively different center frequencies, for band-dividing and filtering an input audio signal supplied thereto thereto through an input terminal;

synchronizing signal generating means for generating a horizontal synchronizing signal, a vertical synchronizing signal, and synchronizing pulses;

first pulse width converting means provided in correspondence with said bandpass filters, for converting the signals from said bandpass filters into signals in synchronism with the synchronizing signal from the synchronizing signal generating means and having pulse widths in accordance with the level of the synchronizing signal;

second pulse width converting means for rectifying said input audio signal, successively holding a higher level of said rectified signal, and converting said held signal into a signal in synchronism with the synchronizing signal from the synchronizing signal generating means, generated with a timing in accordance with the synchronizing signal, and having an arbitrary pulse width;

level indication signal producing and switching means for switching between a mode in which an output of said first pulse width converting means is serially obtained in synchronism with the synchronizing signal from the synchronizing signal generating means by successive time-division carried out during the vertical or horizontal scanning period, and a mode in which outputs of said first and second pulse width converting means are serially obtained in synchronism with the synchronizing signal from the synchronizing signal generating means by successive time-division carried out during the vertical or horizontal scanning period;

character indication signal producing means stored with information signals for displaying characters and the like, for serially obtaining a character indication signal in synchronism with the synchronizing pulses from the synchronizing signal generating means;

composing means driven by said video signal synchronizing signals from the synchronizing signal generating means, for obtaining a video signal by composing an output of said level indication signal producing means and an output of said character indication signal producing means; and a picture tube, said display device switching real-time display bars in a horizontal direction which is in accordance with the output of said first pulse width converting means and maximum value hold display bars in the horizontal direction, and composing and displaying the switched bars with characters and the like, on the picture tube, by the outputs of said composing means.

6. A display device comprising:

a plurality of bandpass filters having filtering bands of respectively different center frequencies, for band-dividing and filtering an input audio signal supplied thereto through an input terminal;

synchronizing signal generating means for generating a horizontal synchronizing signal, a vertical synchronizing signal, and synchronizing pulses;

level indication signal producing means supplied with output signals of said bandpass filters, for converting the thus supplied output signal into a signal in synchronism with the horizontal synchronizing signal from the synchronizing signal generating means and having a pulse width in accordance with the level of the horizontal synchronizing signal, and serially obtaining the converted signal in synchronism with the vertical synchronizing signal from the synchronizing signal generating means by successive time-division carried out during a vertical scanning period;

counting means for counting pulse signals which are in accordance with the levels obtained at said level indication signal producing means, and converting said levels into numerical values;

character indication signal producing means stored with information signals for displaying characters and the like, for serially obtaining a character indication signal and a numerical value indication signal from said counting means in synchronism with the synchronizing pulses from the synchronizing signal generating means;

composing means driven by said video signal synchronizing signals from the synchronizing signal generating means, for obtaining a video signal by composing an output of said level indication signal producing means and an output of said character indication signal producing means; and a picture tube, said display device composing and displaying bars in a horizontal direction corresponding to the audio signal level, characters, numerical values of levels, and the like, on the picture tube, by the outputs of said composing means.

7. A display device comprising:

a plurality of bandpass filters having filtering bands of respectively different center frequencies, for band-dividing and filtering an input audio signal supplied thereto through an input terminal;

synchronizing signal generating means for generating a horizontal synchronizing signal, a vertical synchronizing signal, and synchronizing pulses;

level indication signal producing means supplied with output signals of said bandpass filters, for converting the thus supplied output signal into a signal in synchronism with the horizontal synchronizing signal from the synchronizing signal generating means and having a pulse width in accordance with the level of the horizontal synchronizing signal, and serially obtaining the converted signal in synchronism with the vertical synchronizing signal from the synchronizing signal generating means by successive time-division carried out during a vertical scanning period;

counting means for counting pulse signals which are in accordance with the levels obtained at said level indication signal producing means, and converting said levels into numerical values;

character indication signal producing means stored with information signals for displaying characters and the like, for serially obtaining a character indication signal and a numerical value indication signal from said counting means in synchronism with the synchronizing pulses from the synchronizing signal generating means;

composing means driven by said video signal synchronizing signals from the synchronizing signal generating means, for obtaining a video signal by composing an output of said level indication signal producing means and an output of said character indication signal producing means;

printing means supplied with the numerical value indication signal from said counting means, for printing numerical values of said audio signal levels onto a printing sheet; and a picture tube, said display device composing and displaying bars in a horizontal direction corresponding to the audio signal level, characters, numerical values of levels, and the like, on the picture tube, and printing the numerical values of the levels onto the printing sheet, by the outputs of said composing means, and said printing means.

8. A display device comprising:

a plurality of bandpass filters having filtering bands of respectively different center frequencies, for band-dividing and filtering an input audio signal supplied thereto through an input terminal;

synchronizing signal generating means for generating a horizontal synchronizing signal, a vertical synchronizing signal, and synchronizing pulses;

serially producing means for serially producing the input signal in synchronism with the vertical synchronizing signal from the synchronizing signal generating means by successive time-division carried out during a vertical scanning period;

level indication signal producing means supplied with output signals of said serially producing means, for converting the thus supplied output signal into a signal in synchronism with the horizontal synchronizing signal from the synchronizing signal generating means and having a pulse width in accordance with the level of the horizontal synchronizing signal;

character indication signal producing means stored with information signals for displaying characters and the like, for serially obtaining a character indication signal in synchronism with the synchronizing pulses from the synchronizing signal generating means;

composing means driven by said video signal synchronizing signals from the synchronizing signal generating means, for obtaining a video signal by composing an output of said level indication signal producing means and an output of said character indication signal producing means; and a picture tube;

said display device composing and displaying bars in a horizontal direction corresponding to the audio signal level, characters, and the like, on the picture tube, by the outputs of said composing means.

* * * * *